United States Patent [19]

Ohtsuka

[11] Patent Number: 4,887,804
[45] Date of Patent: Dec. 19, 1989

[54] STAGE MECHANISM
[75] Inventor: Masaru Ohtsuka, Yokohama, Japan
[73] Assignee: Canon Kabushiki Kaisha, Tokyo, Japan
[21] Appl. No.: 125,552
[22] Filed: Nov. 25, 1987
[30] Foreign Application Priority Data Dec. 2, 1986 [JP] Japan .................................. 61-287072

[51] Int. Cl.[4] ............................................. G01B 5/00
[52] U.S. Cl. ........................................ 269/73; 33/568
[58] Field of Search ................ 269/73, 254 R, 60; 279/1 Q, 1 L; 33/568, 1 M, 573; 350/531; 356/344, 244

[56] References Cited

U.S. PATENT DOCUMENTS

| | | | |
|---|---|---|---|
| 3,312,460 | 4/1967 | Kaufman | 269/43 |
| 3,669,462 | 6/1972 | Parsons | 279/1 Q |
| 4,610,442 | 9/1986 | Oku et al. | 269/73 |
| 4,667,415 | 5/1987 | Barsky | 269/73 |

FOREIGN PATENT DOCUMENTS 154146 1/1980 Fed. Rep. of Germany ........ 33/568

Primary Examiner—Robert C. Watson
Attorney, Agent, or Firm—Fitzpatrick, Cella, Harper & Scinto

[57] ABSTRACT

A stage mechanism usable in a semiconductor device manufacturing apparatus, for carrying and positioning a semiconductor wafer with high accuracy and at high speed, is disclosed. The stage device includes a reference portion and a stage portion resiliently supported by the reference portion. Further, a solid damper such as a rubber member is disposed between the reference portion and the stage portion, so as to provide a resistance to the displacement of the stage portion. Thus, with the disclosed device, any residual vibration of the stage portion after the displacement of the stage can be damped quickly, with a simple and compact structure.

11 Claims, 4 Drawing Sheets

STAGE MECHANISM

FIELD OF THE INVENTION AND RELATED ART

This invention relates to a stage mechanism usable in semiconductor device manufacturing apparatuses or otherwise, wherein high-precision and high-speed positioning is required.

An example of such a stage device is disclosed in Japanese Laid-Open Utility Model Application, Laid-Open No. Sho 58-105604. Another example is disclosed in Japanese Laid-Open Patent Application, Laid-Open No. Sho 62-79645, filed in Japan and is commonly assigned herewith.

In this type of stage devices, residual vibration of the stage after movement of the same is an major impediment to the high-precision and high-speed positioning. In an attempt in solving such a problem, the aforementioned Japanese Laid-Open Utility Model Application, Laid-Open No. Sho 58-105604 has proposed that vibration attenuating elements each having a surface substantially parallel to the direction of movement of the stage being provided below the stage and as a unit with the stage, the vibration attenuating elements being dipped in a silicon oil having high viscosity, with the result that a damping effect for the stage is obtained. Since, however, the proposed method uses a liquid such as the silicon oil or otherwise, it is necessary to provide the stage with a sealing mechanism or otherwise to prevent leakage of the liquid. As a result, the structure is complicated as a whole. Further, in the proposed arrangement, each vibration attenuating element is spaced from the stage with respect to a direction perpendicular to the direction of movement of the stage. Therefore, it is not easy to damp the residual vibration precisely, as desired.

SUMMARY OF THE INVENTION

It is accordingly a primary object of the present invention to provide a stage mechanism by which residual vibration of the stage, after movement thereof, can be effectively damped with a simple structure and, as a result of which, high-precision and high-speed positioning of the stage is ensured.

In accordance with one aspect of the present invention, to achieve this object, there is provided a stage mechanism having a stage portion and a reference portion for supporting the stage portion. Also, the stage mechanism includes a solid damper provided between the stage portion and the reference portion, at a position which is on the direction of movement of the stage portion. A damping material having weak stiffness such as rubber, low-elasticity resin, low-elasticity bonding agent or otherwise may be used as the solid damper.

Another object of the present invention is to provide a stage mechanism which is specifically adapted to displace and position a stage with high precision and high speed, particularly by use of a specific drive source.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

Figure 1:
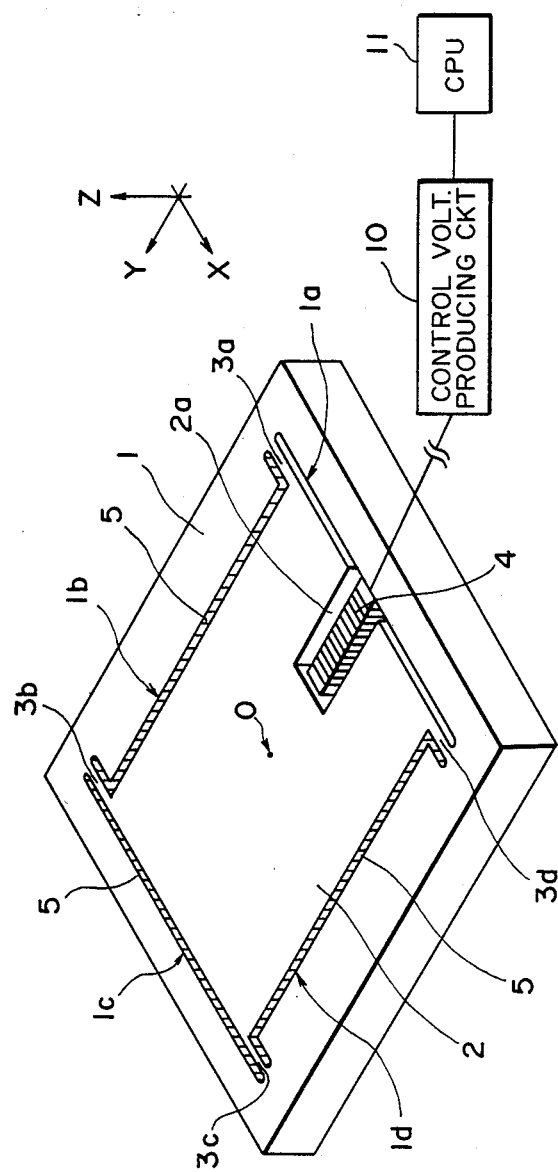
FIG. 1 is a schematic and diagrammatic view of a stage device according to one embodiment of the present invention.

Referring first to FIG. 1, there is shown a stage device according to a first embodiment of the present invention. As shown in FIG. 1, the stage device includes a reference portion 1 which is a fixed portion and comprises, in this embodiment, a base member. The device further includes a stage 2 which is a movable or displaceable member. There are provided leaf springs 3a-3d which are adapted to flexibly support the stage 2 upon the base 1 so that the stage 2 is movable or displaceable relative to the base 1 along an axis Y. Each of the leaf springs 3a-3d has an end thereof fixed to corresponding one of four corners of the stage 2 and another end of each leaf spring is supported by the base 1. Each leaf spring extends along an axis X which is perpendicular to the Y-axis direction. On one side of the stage 2, the leaf springs 3a and 3b cooperate with each other to provide a parallel leaf spring mechanism while, on the opposite side of the stage 2, the leaf springs 3c and 3d cooperate with each other to provide another parallel leaf spring mechanism. Between the base 1 and the stage 2, there are formed gaps 1a-1d. Of these gaps, each of the gaps 1a and 1c is defined by a space extending in parallel to the X-axis direction. On the other hand, each of the gaps 1b and 1d is defined by a space extending in parallel to the Y-axis direction. The stage device further includes an actuator 4 having an end thereof fixed to the base 1 and another end contacting the stage 2. In this embodiment, the actuator 4 comprises a piezoelectric device. The actuator 4 comprising a piezoelectric device is deformable in the Y-axis direction. By energizing the actuator 4 to cause it to press the stage 2 toward the base 1, the stage 2 is displaced minutely in the Y-axis direction. The piezoelectric device 4 is disposed in a groove 2a which is formed to extend from one side surface of the stage 2 toward the center O of the stage 2. It should be noted that the stage device of the present embodiment is arranged so that the pressing force of the piezoelectric device 4 acts exactly upon the "center" of the stage 2 which is with respect to the X-axis direction and a Z-axis direction (a direction perpendicular to the X and Y axes).

The device is further provided with damping rubber members 5 disposed in the gaps 1b-1d, respectively, defined between the base 1 and the stage 2. Each of the damping rubber members 5 has a width, in the Z-axis direction, which is approximately equal to the thickness of the stage 2 in the Z-axis direction. Also, each damping rubber member is disposed symmetrically in the Z-axis direction with respect to the center O of the stage 2.

The stage device further includes a controlling voltage producing circuit 10 for producing an electric voltage to control the expansion/contraction of the piezoelectric device 4, and a central processing unit 11 for producing instruction signals which are applied to the controlling voltage producing circuit 10. In this embodiment, the base 1, the stage 2 and the leaf springs 3a-3d are formed by slotting a single and integral plate-like member to define the gaps 1a-1d and the groove 2a. Subsequently, each of the gaps 1b-1d is filled with a liquefied rubber material. The rubber material is set up by cooling, whereby the damping rubber member 5 is formed. Since the amount of displacement of the stage 2 by the deformation of the piezoelectric device 4 is small, such as rubber material as elastically deformable only by a small amount can be satisfactorily used as the damping member.

If the damping rubber members 5 of the present embodiment are omitted and when an electric voltage rising quickly is applied to the piezoelectric device 4 from the controlling voltage producing circuit 10 in response to an instruction signal from the central processing unit 11, the stage 2 is displaced with a large acceleration by the pressing force of the piezoelectric device 4. As a result, when the stage reaches a desired position, residual vibration due occurs to the inertia. The vibration gradually ceases and the stage is finally positioned at the desired position. Accordingly, it requires a long time period until the vibration is ceased. In the stage device of the present embodiment, as compared therewith, use of the damping rubber members 5 effectively avoids such disadvantage. Namely, when the stage 2 is driven in a similar manner, the viscosity of each damping rubber member 5 is effective to absorb the vibration energy of the stage 2 after it reaches the desired position, with the result that the residual vibration is damped quickly. Therefore, the vibration is stopped in a very short time so that the stage 2 can be positioned promptly at the desired position. Further, the provision of the damping members around the stage 2, by filling, is very effective because not only the vibration component in the direction of displacement of the stage 2 (i.e. in the Y-axis direction) but also vibration components in the other directions can be damped sufficiently and quickly.

Figure 2A:
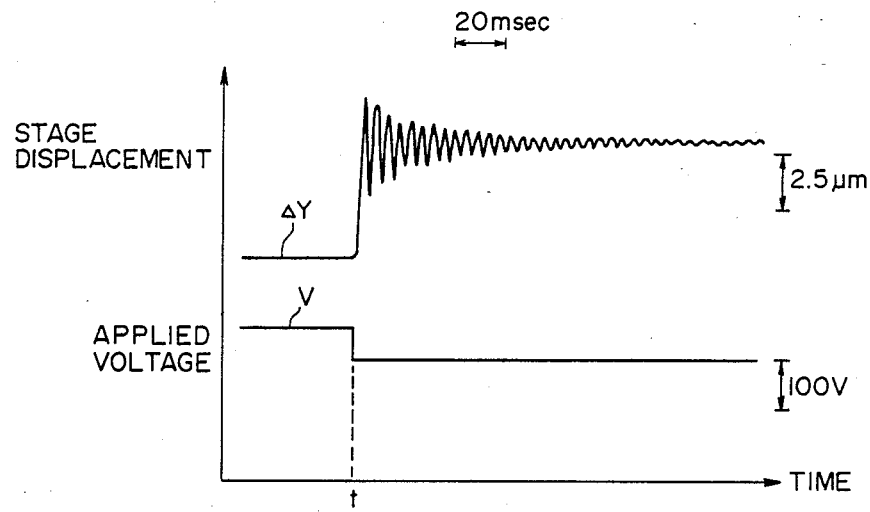
FIGS. 2A and 2B are graphs showing data obtained as a result of experiments, made to clarify advantageous effects of the present invention.
Figure 2B:
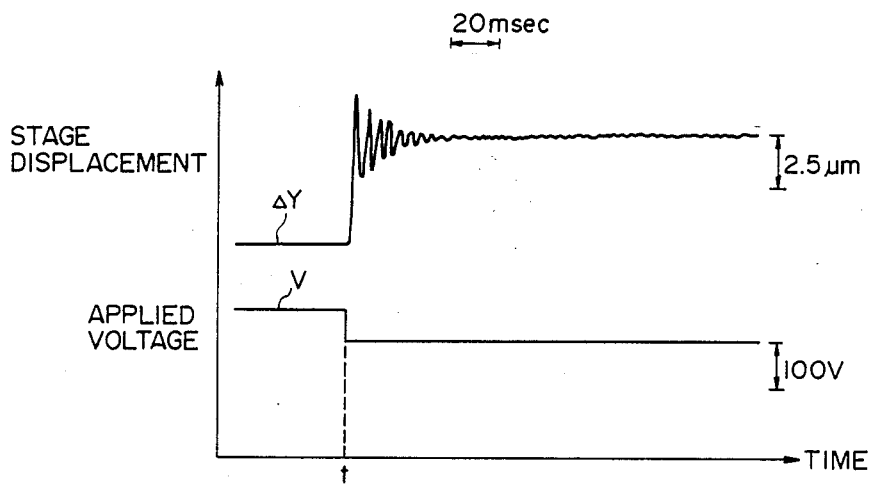

Comparison experiments were made to a stage device of the present embodiment having damping rubber members 5 and to a similar stage device but having no such damping rubber member. The results are shown in FIGS. 2A and 2B. FIG. 2A is concerned with the stage device without using any damping rubber member. In the graph of FIG. 2A, a lower curve V shows an electric voltage applied to a piezoelectric device from a controlling voltage producing circuit. An upper curve $\Delta Y$ shows displacement of a stage such as at 2 in FIG. 1 in response to the voltage application. FIG. 2B is concerned with the stage device of the present embodiment and the curves V and $\Delta Y$ corresponds respectively to those shown in FIG. 2A. In both cases, the displacing electric voltage was applied at time t. Comparing FIGS. 2A and 2B, it is seen that the provision of the damping rubber members in the stage device, as in the present embodiment, is effective to ensure high damping property at the time of positioning of the stage 2.

In place of using a damping rubber member such as at 5 of the present embodiment, a low-elasticity resin such as polyethylene may be used. If this is desired, the resin in a liquefied state is flown into the gaps 1b-1d (FIG. 1) and, when the resin is set up by cooling, damping members are formed. Alternatively, each gap may be filled with a rubber-series bonding agent, the agent when it is set up providing a damping member. For the setup of the low-elasticity resin, a suitable setting agent may be used.

Figure 3:
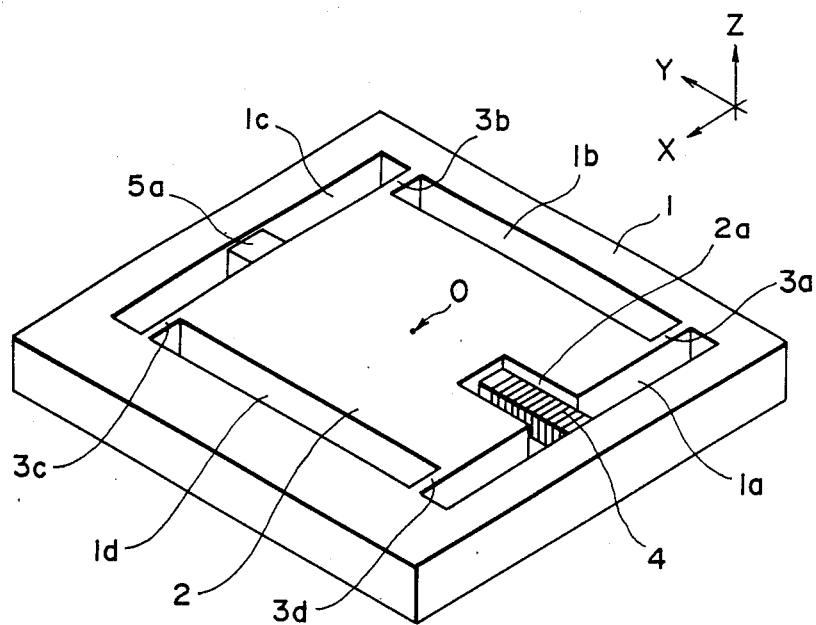
FIGS. 3-5 are perspective views, respectively, schematically showing stage devices according to further embodiments of the present invention.

FIG. 3 shows a stage device according to a second embodiment of the present invention. Same reference numerals as in the FIG. 1 embodiment are assigned to corresponding elements. Also, while not shown in FIG. 3, an actuator 4 comprising a piezoelectric device is electrically connected to a central processing unit (not shown) by way of a controlling voltage producing circuit (also not shown).

In this embodiment, a damping rubber member 5a is provided between a base 1 and a stage 2. The damping rubber member 5a has been formed separately from the base 1 and the stage 2. As shown, the damping rubber member 5a is disposed in a gap 1c and are attached, by adhesion, to each of the base 1 and the stage 2. The rubber member 5a is disposed so that the center thereof agrees with the center O of the stage 2 with respect to a plane containing the X and Z axes. Namely, it is disposed so that a line connecting the center of the member 5a and the center O of the stage 2 extends in parallel to the Y-axis. The rubber member 5a may of course be formed by filling a space between the base 1 and the stage 2 with a liquefied rubber material.

In order to apply a pressing force to the stage 2 which force is directed to the piezoelectric device 4, even when leaf springs 3a-3d are not deformed, the damping rubber member 5a upon assembling is compressed and inserted into the gap 1c. Additionally, the piezoelectric device 4 is so set that no deformation occurs in each of the leaf springs 3a-3d when the piezoelectric device 4 is in a state in which it is contracted to the minimum length in the Y-axis direction. By doing so, even when the piezoelectric device 4 is contracted to its minimum size, the stage 2 is pressed with certainty against the piezoelectric device 4. This results in an advantage of reducing the required maximum deformation of each leaf spring. This will be best understood in comparison with a case where the stage 2 is pressed against the piezoelectric device 4 by the deformation of the leaf springs 3a-3d when the piezoelectric device 4 is contracted to the minimum length.

With the structure of the present embodiment, the residual vibration at the time of drive of the stage 2 can be damped quickly and ceased in a very short time, with the result that the stage 2 is stopped at the desired position promptly.

Figure 4:
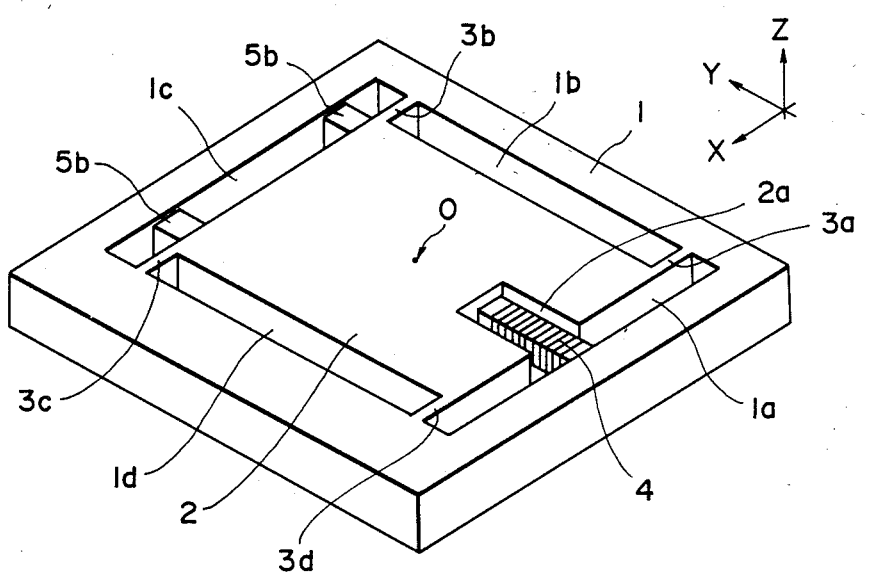

FIG. 4 shows another embodiment of the present invention, wherein same reference numerals as of the foregoing embodiments are assigned to corresponding elements. In the FIG. 4 embodiment, a pair of damping rubber members 5b are disposed in a gap 1c and at positions off a rectilinear line parallel to the Y-axis and passing through the center O of a stage 2. Also, these rubber members 5b are disposed symmetrically with respect to the rectilinear line parallel to the Y-axis and passing through the center O. By disposing plural rubber members in the manner described above and shown in FIG. 4, it becomes possible to sufficiently damp not only the vibration component in the direction of drive of the stage 2 (i.e. in the Y-axis direction) but also vibration components in the other directions, particularly the vibration components in the yawing direction.

Figure 5:
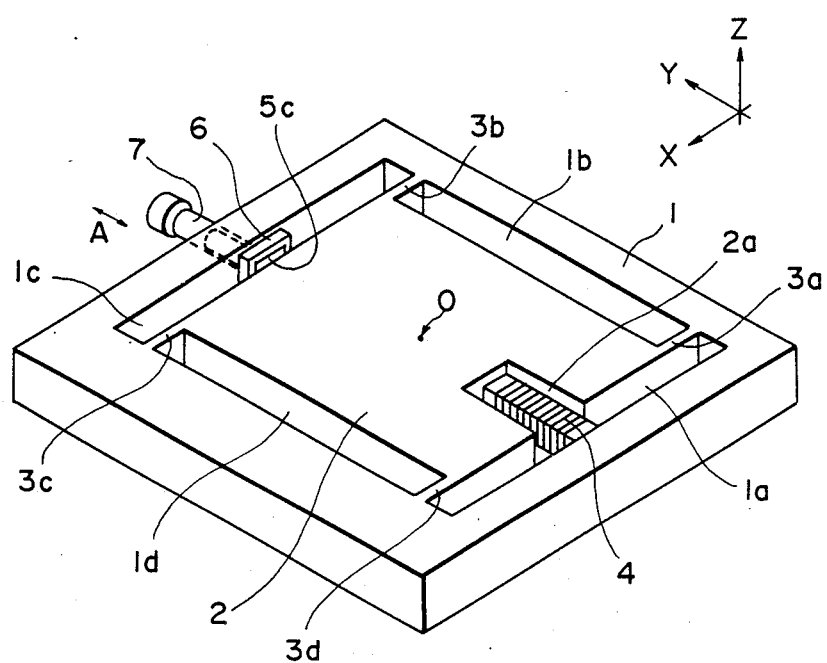

FIG. 5 shows a further embodiment of the present invention, wherein the same reference numerals as of the foregoing embodiments are assigned to corresponding elements. In the FIG. 5 embodiment, a damping rubber member 5c is mounted to a base 1 via an adjusting member 6. The damping rubber member 5c is fixedly secured to the adjusting member 6 and is arranged to simply abut against the stage 2. The adjusting member 6 is displaceable in opposite directions, denoted by an arrow A, parallel to the Y-O axis direction under the influence of an adjusting screw 7. With this arrangement, the pressing force of the damping rubber member 5 against the stage 2 is made adjustable by the cooperation of the adjusting member 6 and the adjusting screw 7. This allows that a "pilot pressure" of the stage 2 to the piezoelectric device 4 in the Y-axis direction is selected as desired. Leaf springs 3a–3d when they are deformed act to press the stage 2 against the piezoelectric device 4, such that the expansion/contraction of the piezoelectric device 4 can be transmitted to the stage 2 promptly. Since it is not preferable to deform the leaf springs 3a–3d by a large amount, the adjustment should suitably be made such that the required maximum deformation of the leaf springs 3a–3d becomes smallest while assuring that the leaf springs are stably operable to cause the stage 2 to constantly press the piezoelectric device 4, namely the leaf springs do not deform when the piezoelectric device 4 is contracted to the minimum. In such case, however, the pressing force for pressing the stage 2 to the piezoelectric device 4 is very small when the piezoelectric device 4 is contracted to the minimum. Accordingly, it is possible that the stage 2 is separated from the piezoelectric device 4. If this occurs, a gap (backlash) is disadvantageously formed between the stage 2 and the piezoelectric device 4.

In this embodiment, the pressing force of the damping rubber member 5 which is a damper member is adjustable by adjusting the adjusting member 6 by the adjusting screw 7. Therefore, it is possible to prevent the backlash by adjusting the screw 7 so that the stage 2 is pressed toward the piezoelectric device 4 even in an occasion that the piezoelectric device 4 is contracted to its minimum size and the leaf springs 3a–3d do not deform. Accordingly, it is not necessary to load the leaf springs 3a–3d when the piezoelectric device 4 is contracted to the minimum or to provide additional "pilot pressure" applying means. Moreover, according to the present embodiment, the pressing force can be suitably adjusted so that the stage 2 is sufficiently pressed against the piezoelectric device 4 and that the rubber member 5c can sufficiently deform when the piezoelectric device 4 drives the stage 2. Additionally, the pressing force can be changed as desired, in accordance with the required displaceable range of the stage or any change of the piezoelectric device and/or the leaf springs by aging. If desired, it is possible to adjust the screw 7 so as to isolate the rubber member 5c from the stage 2 so that the stage 2 is driven and stopped without the damper member.

When, in the above-described embodiments, a low gas emissive type fluorine-series rubber such as, for example, VITON (trade name) or a nitrile rubber is used as the material of the damping rubber member 5, the stage device can be used within a high-vacuum chamber because a problem of gas emission from the rubber material does not occur which causes damage to the vacuum. That is, use of such a low gas-emissive type rubber material makes it possible to use the stage of the present embodiment in a high-vacuum ambience.

Use of a solid damper such as a damping rubber material, low-elasticity resin, low-elasticity bonding agent or otherwise, acting on the stage portion (movable portion) of the stage device, as described hereinbefore, provides various advantageous effects such as follows:

(1) The residual vibration at the time of drive of the movable stage can be damped quickly with the result that the stage can be positioned at a desired location in a very short time.

(2) The damper means can be placed in various ways and the position thereof can be changed easily. As a result, it is easy to arrange the stage device so that not only the vibration component in the direction of drive of the stage but also the vibration components in the other directions can be damped quickly and sufficiently.

(3) The operating force of the damper to the stage portion is made adjustable, which avoids the necessity of provision of mechanisms and elements for adjusting the "pilot pressure" to the piezoelectric device used as a drive source.

(4) The damper means can be made at a lower cost, as compared with a damper using a damping liquid. Further, the damper means can be made in a simple manner, i.e. by filling a gap between the stage portion and the reference portion (base) of the stage device with a damping rubber material.

(5) The stage device can be easily modified for use in a vacuum ambience.

While the invention has been described with reference to the structures disclosed herein, it is not confined to the details set forth and this application is intended to cover such modifications or changes as may come within the purposes of the improvements or the scope of the following claims.

What is claimed is:

1. A stage mechanism, comprising:
   a reference portion;
   a stage portion displaceably supported by said reference portion;
   a drive source for displacing in a predetermined direction said stage portion relative to said reference portion; and
   a vibration attenuating member provided between said reference portion and said stage portion for attenuating vibration caused when said stage portion is displaced by said drive source relative to said reference portion.

2. A mechanism according to claim 1, wherein said vibration attenuating member is disposed between said reference portion and the stage portion with respect to said predetermined direction.

3. A mechanism according to claim 2, wherein said drive source includes a piezoelectric element operable to press said stage portion in the predetermined direction, said piezoelectric element being disposed at a side of said stage portion which is opposite to a side of said stage portion at which said vibration attenuating member is disposed.

4. A mechanism according to claim 1, wherein a pair of vibration attenuating members are provided at positions which are substantially symmetrical with respect to a rectilinear line parallel to the predetermined direction and passing through the center of said stage.

5. A mechanism according to claim 1, wherein said vibration attenuating member is supported by said reference portion for movement in the predetermined direction.

6. A mechanism according to claim 1, wherein said vibration attenuating member is formed between said reference portion and said stage portion by filling.

7. A mechanism according to claim 1, wherein said stage portion is supported by said reference portion by a parallel leaf spring mechanism.

8. A mechanism according to claim 1, wherein said vibration attenuating member comprises an attenuating rubber member.

9. A mechanism according to claim 1, wherein said vibration attenuating member is made from a material selected from the group of a low-elasticity resin and a low-elasticity bonding agent.

10. A mechanism according to claim 8, wherein said attenuating rubber member is made of fluorine series rubber.

11. A stage mechanism comprising:
a single base plate member;
a reference portion;
a stage portion;
a flexible coupling member for coupling said reference portion and said stage portion for relative displacement therebetween, wherein said reference portions, said stage portion and said coupling member are provided by forming a groove in said single base plate member;
a drive source fixed to said reference portion, for displacing in a predetermined direction said stage portion relative to said reference portion; and
a vibration attenuating member provided in the groove, for attenuating vibration caused when said stage portion is relatively displaced by said drive source.

* * * * *

UNITED STATES PATENT AND TRADEMARK OFFICE
CERTIFICATE OF CORRECTION

PATENT NO. : 4,887,804
DATED : December 19, 1989
INVENTOR(S) : MASARU OHTSUKA

It is certified that error appears in the above-identified patent and that said Letters Patent is hereby corrected as shown below:

On the title page:

IN [56] REFERENCES CITED

FOREIGN PATENT DOCUMENTS, "154146  1/1980   Fed. Rep. of Germany" should read --0154146  2/1982  Dem. Rep. of Germany--.

COLUMN 1

Line 18, "an" should read --a--.

COLUMN 3

Line 22, "due occurs" should read --occurs due--.
Line 54, "corresponds" should read --correspond--.
Line 65, "flown" should read --flowed--.

COLUMN 4

Line 5, "Same" should read --The same--.
Line 16, "are" should read --is--.
Line 50, "same" should read --the same--.

COLUMN 5

Line 6, "Y-O axis direction" should read --Y-axis direction--.

UNITED STATES PATENT AND TRADEMARK OFFICE
CERTIFICATE OF CORRECTION

PATENT NO. : 4,887,804
DATED : December 19, 1989
INVENTOR(S) : MASARU OHTSUKA

Page 2 of 2

It is certified that error appears in the above-identified patent and that said Letters Patent is hereby corrected as shown below:

COLUMN 6

Line 48, "the" should read --said--.
Line 49, "said" should read --the--.

COLUMN 8

Line 6, "portions," should read --portion,--.

Signed and Sealed this

Twenty-fourth Day of September, 1991

Attest:

HARRY F. MANBECK, JR.

Attesting Officer

Commissioner of Patents and Trademarks